United States Patent
Belhachemi et al.

(10) Patent No.: US 12,167,694 B2
(45) Date of Patent: Dec. 10, 2024

(54) METHOD FOR TRANSFERRING A PIEZOELECTRIC LAYER ONTO A SUPPORT SUBSTRATE

(71) Applicant: Soitec, Bernin (FR)

(72) Inventors: Djamel Belhachemi, Saint Martin d'Heres (FR); Thierry Barge, Chevrieres (FR)

(73) Assignee: SOITEC, Bernin (FR)

( * ) Notice: Subject to any disclaimer, the term of this patent is extended or adjusted under 35 U.S.C. 154(b) by 946 days.

(21) Appl. No.: 17/041,355

(22) PCT Filed: Mar. 21, 2019

(86) PCT No.: PCT/FR2019/050645
§ 371 (c)(1),
(2) Date: Sep. 24, 2020

(87) PCT Pub. No.: WO2019/186032
PCT Pub. Date: Oct. 3, 2019

(65) Prior Publication Data
US 2021/0020826 A1    Jan. 21, 2021

(30) Foreign Application Priority Data
Mar. 26, 2018    (FR) ...................... 1852573

(51) Int. Cl.
*H10N 30/057*    (2023.01)
*H03H 3/02*    (2006.01)
*H10N 30/073*    (2023.01)

(52) U.S. Cl.
CPC ............ *H10N 30/057* (2023.02); *H03H 3/02* (2013.01); *H10N 30/073* (2023.02); *H03H 2003/025* (2013.01)

(58) Field of Classification Search
CPC ...... H10N 30/057; H10N 30/073; H03H 3/02; H01L 21/76254
See application file for complete search history.

(56) References Cited

U.S. PATENT DOCUMENTS

| 8,142,593 B2 * | 3/2012 | Deguet | ............. | H01L 21/76254 |
| | | | | 438/455 |
| 8,252,663 B2 * | 8/2012 | Fournel | ................. | H01L 21/187 |
| | | | | 257/E21.211 |

(Continued)

FOREIGN PATENT DOCUMENTS

| CN | 1864326 A | 11/2006 | |
| CN | 100483666 C * | 4/2009 | ....... H01L 21/02032 |

(Continued)

OTHER PUBLICATIONS

International Search Report for International Application No. PCT/FR2019/050645 dated May 22, 2019, 2 pages.

(Continued)

*Primary Examiner* — Jeffrey T Carley
(74) *Attorney, Agent, or Firm* — TraskBritt

(57) ABSTRACT

A method for transferring a piezoelectric layer onto a support substrate comprises: —providing a donor substrate including a heterostructure comprising a piezoelectric substrate bonded to a handling substrate, and a polymerized adhesive layer at the interface between the piezoelectric substrate and the handling substrate, —forming a weakened zone in the piezoelectric substrate, so as to delimit the piezoelectric layer to be transferred, —providing the support substrate, —forming a dielectric layer on a main face of the support substrate and/or of the piezoelectric substrate, —bonding the donor substrate to the support substrate, the dielectric layer being at the bonding interface, and—frac- (Continued)

turing and separating the donor substrate along the weakened zone at a temperature below or equal to 300° C.

20 Claims, 4 Drawing Sheets

(56) References Cited

U.S. PATENT DOCUMENTS

| | | | |
|---|---|---|---|
| 10,325,926 B2* | 6/2019 | Tang | H10B 12/20 |
| 11,159,140 B2* | 10/2021 | Gaudin | H03H 9/02818 |
| 2003/0082889 A1* | 5/2003 | Maruyama | H10K 71/50 |
| | | | 438/455 |
| 2003/0186521 A1* | 10/2003 | Kub | H10N 30/073 |
| | | | 438/558 |
| 2003/0199105 A1* | 10/2003 | Kub | H01L 21/76254 |
| | | | 438/48 |
| 2005/0048738 A1 | 3/2005 | Shaheen et al. | |
| 2007/0200458 A1 | 8/2007 | Yoshino et al. | |
| 2010/0190000 A1 | 7/2010 | Faure et al. | |
| 2016/0043269 A1 | 2/2016 | Lagoutte et al. | |

FOREIGN PATENT DOCUMENTS

| | | | |
|---|---|---|---|
| CN | 102097298 A | 6/2011 | |
| CN | 104175738 A | 12/2014 | |
| EP | 0924769 A1 * | 6/1999 | |
| FR | 0924769 B1 | 9/2006 | |
| FR | 3045933 A1 * | 6/2017 | A61B 5/14546 |
| JP | 2005-229455 A | 8/2005 | |
| JP | 5547682 B2 | 7/2014 | |
| KR | 10-2014-0008286 A | 1/2014 | |
| WO | WO-2012004250 A1 * | 1/2012 | H01L 41/22 |
| WO | WO-2017052646 A1 * | 3/2017 | |

OTHER PUBLICATIONS

International Written Opinion for International Application No. PCT/FR2019/050645 dated May 22, 2019, 8 pages.
Korean Office Action for Application No. 10-2020-7029598 dated Dec. 12, 2023, 10 pages with machine translation.
Chinese Second Office Action for Application No. 201980021982.3 dated Oct. 13, 2023, 3 pages.
Chinese Second Search Report for Application No. 201980021982.3 dated Oct. 13, 2023, 2 pages.

* cited by examiner

METHOD FOR TRANSFERRING A PIEZOELECTRIC LAYER ONTO A SUPPORT SUBSTRATE

CROSS-REFERENCE TO RELATED APPLICATIONS

This application is a national phase entry under 35 U.S.C. § 371 of International Patent Application PCT/FR2019/050645, filed Mar. 21, 2019, designating the United States of America and published as International Patent Publication WO 2019/186032 A1 on Oct. 3, 2019, which claims the benefit under Article 8 of the Patent Cooperation Treaty to French Patent Application Ser. No. 1852573, filed Mar. 26, 2018.

TECHNICAL FIELD

The present disclosure relates to a process for producing a donor substrate for the transfer of a piezoelectric layer, and a process for transferring such a piezoelectric layer. The present disclosure is applicable, in particular, to the production of radiofrequency devices, such as resonators or filters.

BACKGROUND

It is known practice to produce a radiofrequency (RF) device, such as a resonator or filter, on a substrate comprising, successively, from its base to its surface, a carrier substrate, generally made of a semiconductor material such as silicon, an electrically insulating layer and a piezoelectric layer.

Bulk acoustic wave (BAW) devices typically comprise a thin piezoelectric layer (i.e., with a thickness generally substantially less than 1 µm) and two electrodes arranged on each main face of the thin layer. An electrical signal, typically a voltage variation, applied to an electrode is converted into an elastic wave, which propagates through the piezoelectric layer. The propagation of this elastic wave is promoted if the frequency of the wave corresponds to the frequency band of the filter. This wave is converted into an electrical signal again when it reaches the electrode located on the opposite face.

The piezoelectric layer is typically obtained by transferring a thick substrate of a piezoelectric material (for example, obtained by slicing an ingot) to a carrier substrate. The carrier substrate is, for example, a silicon substrate.

The transfer of the piezoelectric layer entails bonding the thick piezoelectric substrate to the carrier substrate, followed by thinning the thick piezoelectric substrate so as to leave only a thin piezoelectric layer on the carrier substrate, of the desired thickness for producing the RF device.

For good adhesion of the piezoelectric substrate to the carrier substrate, a layer of oxide (for example, a silicon oxide $SiO_2$) is generally deposited on each of the two substrates, and the substrates are bonded via the oxide layers.

To strengthen such oxide-oxide bonding, it is known practice to perform, before bonding, plasma activation of the surfaces to be bonded, and, after bonding, a consolidating anneal.

The consolidating anneal is typically carried out at a temperature of between 100° C. and 300° C.

However, since the piezoelectric material and the material of the carrier substrate have very different thermal expansion coefficients, implementing such an annealing causes the assembly to deform substantially.

To overcome this type of problem, it is known practice to use a donor virtual substrate, that is to say a heterostructure in which the thick piezoelectric substrate is bonded to a handle substrate. Thus, after bonding the donor virtual substrate and the carrier substrate, the thick piezoelectric substrate is held between the handle substrate and the carrier substrate. The choice of materials and thicknesses of the handle substrate and of the carrier substrate makes it possible to ensure a certain symmetry of the thermal expansion coefficients, and thus to minimize the deformation of the assembly during the application of heat treatments.

The donor virtual substrate could thus be produced by joining the thick piezoelectric substrate and a silicon substrate, each covered with an oxide layer.

However, such a heterostructure has several drawbacks.

First, depositing an oxide layer on the thick piezoelectric substrate causes the piezoelectric substrate to curve (bow) substantially, which is not very compatible with the later steps of the process, which are designed for flat substrates.

Furthermore, the formation of the oxide layers required for bonding is lengthy and expensive.

Lastly, as mentioned above, the heterostructure cannot undergo the consolidating anneal because of the differences in thermal expansion coefficients between the thick piezoelectric substrate and the handle substrate. However, in the absence of the consolidating anneal, the bonding energy of the oxide layers of the two substrates remains very low, such that the mechanical strength of the donor virtual substrate is insufficient. Consequently, a break at the bonding interface may occur during the step of thinning the thick piezoelectric substrate.

BRIEF SUMMARY

One object of the present disclosure is to overcome the aforementioned drawbacks and, in particular, to design a donor substrate for the transfer of a thin piezoelectric layer from a thick substrate to a carrier substrate, which is less expensive to produce, which has better mechanical strength and/or which has a lower curvature than existing substrates.

To this end, the present disclosure provides a process for producing a donor substrate for the transfer of a piezoelectric layer to a carrier substrate, the process comprising the following steps:
  providing a piezoelectric substrate;
  providing a handle substrate;
  depositing a photopolymerizable adhesive layer on a main face of the handle substrate or of the piezoelectric substrate;
  bonding the piezoelectric substrate to the handle substrate via the adhesive layer, to form a heterostructure;
  irradiating the heterostructure with a light flux in order to polymerize the adhesive layer, so as to form the donor substrate.

Implementing a photopolymerizable adhesive layer to assemble the heterostructure making up the donor substrate makes it possible to endow the substrate with good mechanical strength while avoiding the process steps implemented at high temperature that are capable of causing the substrate to curve substantially. Furthermore, the formation of such an adhesive layer is very straightforward to implement and is inexpensive.

According to other aspects, the proposed production process has the following various features, which may be implemented alone or in technically feasible combinations thereof:

the thickness of the photopolymerizable adhesive layer is between 2 μm and 8 μm;

the photopolymerizable adhesive layer is deposited by spin coating;

the bonding step is implemented at a temperature of between 20° C. and 50° C., preferably between 20° C. and 30° C.;

the light flux is applied through the piezoelectric substrate;

the irradiation is pulsed;

the light flux has a wavelength of between 320 nm and 365 nm;

the handle substrate and the carrier substrate are made of materials such that the difference in thermal expansion coefficient between the material of the handle substrate and the material of the carrier substrate is less than or equal to 5%, and preferably approximately equal to 0%;

the handle substrate is made of silicon, of sapphire, of polycrystalline aluminum nitride (AlN), or of gallium arsenide (GaAs).

Another subject of the present disclosure relates to a process for transferring a piezoelectric layer to a carrier substrate, comprising:

providing a donor substrate obtained by implementing the production process described above;

forming a weakened zone in the piezoelectric substrate, so as to delimit the piezoelectric layer to be transferred;

providing the carrier substrate;

forming a dielectric layer on a main face of the carrier substrate and/or of the piezoelectric substrate;

bonding the donor substrate to the carrier substrate, the dielectric layer being at the bonding interface;

splitting and separating the donor substrate along the weakened zone, at a temperature less than or equal to 300° C.

According to other aspects, the proposed transfer process has the following various features, which may be implemented alone or in technically feasible combinations thereof:

the dielectric layer is a glass layer deposited by spin coating on the piezoelectric substrate;

the process comprises, prior to bonding, the formation of an oxide layer, or a nitride layer, or a layer comprising a combination of nitride and oxide, or a superposition of at least one oxide layer and one nitride layer on the carrier substrate;

the weakened zone is formed by implanting atomic species into the piezoelectric substrate;

the handle substrate is a substrate made of silicon, of sapphire, of polycrystalline aluminum nitride (AlN), or of gallium arsenide (GaAs);

the thickness of the polymerized adhesive layer is between 2 μm and 8 μm.

Another subject of the present disclosure relates to a process for producing a bulk acoustic wave device, comprising the deposition of electrodes on two opposite faces of a piezoelectric layer. This process comprises producing the piezoelectric layer by means of a transfer process described above.

The present disclosure also relates to a donor substrate for the transfer of a piezoelectric layer, consisting of a heterostructure comprising a piezoelectric substrate bonded to a handle substrate. The substrate comprises, at the interface between the piezoelectric substrate and the handle substrate, a polymerized adhesive layer.

BRIEF DESCRIPTION OF THE DRAWINGS

Other features and advantages of the present disclosure will emerge from the detailed description that follows, with reference to the appended drawings, in which.

For the sake of legibility of the figures, the illustrated elements are not necessarily shown to scale. Moreover, elements designated by the same reference signs in the various figures are identical or perform the same function.

DETAILED DESCRIPTION

A first subject of the present disclosure relates to a process for producing a donor substrate for the transfer of a piezoelectric layer to a carrier substrate.

The donor substrate is produced by bonding a piezoelectric substrate to a handle substrate.

The handle substrate comprises a material whose thermal expansion coefficient is close to that of the material of the carrier substrate to which the piezoelectric layer is intended to be transferred. What is meant by "close" is that a difference in thermal expansion coefficient between the material of the handle substrate and the material of the carrier substrate is less than or equal to 5%, and preferably equal to or close to 0%. Suitable materials are, for example, silicon, sapphire, polycrystalline aluminum nitride (AlN), or gallium arsenide (GaAs). In the present disclosure, it is the thermal expansion coefficient in a plane parallel to the main surface of the substrates that is of interest.

Figure 1:
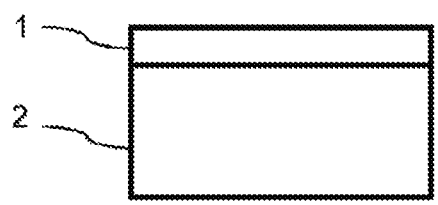
FIG. 1 schematically illustrates the step of depositing the photopolymerizable adhesive layer on the handle substrate.

According to a first step shown in FIG. 1, a photopolymerizable adhesive layer 1 is deposited on an exposed face of the handle substrate 2 or of the piezoelectric substrate 3. In FIG. 1, the deposition is performed on the handle substrate 2.

The photopolymerizable adhesive layer 1 is advantageously deposited by spin coating. This technique involves rotating the substrate on which the photopolymerizable layer is to be deposited at a substantially constant and relatively high speed in order to spread the photopolymerizable layer uniformly over the entire surface of the substrate by centrifugal force. To this end, the substrate is typically placed and held by vacuum chuck on a turntable.

A person skilled in the art is capable of determining the operating conditions, such as the volume of adhesive deposited on the surface of the substrate, the speed of rotation of the substrate, and the minimum deposition time according to the desired thickness for the adhesive layer.

The thickness of the photopolymerizable adhesive layer is typically between 2 and 8 μm.

According to one non-limiting example, the photopolymerizable adhesive layer sold under the reference "NOA 61" by NORLAND PRODUCTS may be used in embodiments of the present disclosure.

Figure 2:
FIG. 2 schematically illustrates the step of providing the thick piezoelectric substrate.
Figure 3:
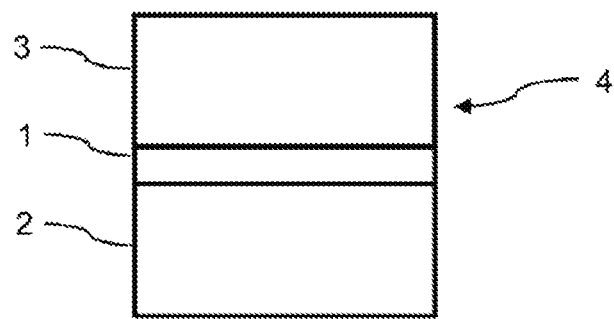
FIG. 3 schematically illustrates a heterostructure obtained by bonding the piezoelectric substrate to the handle substrate by means of the adhesive layer.

The piezoelectric substrate 3, as shown in FIG. 2, is then bonded to the handle substrate via the adhesive layer 1, in order to form a heterostructure 4, one embodiment of which is shown in FIG. 3.

The heterostructure 4 is thus formed from the superposition of the handle substrate 2, of the adhesive layer 1, and of the piezoelectric substrate 3, the adhesive layer 1 being located at the interface between the handle substrate and the piezoelectric substrate.

The bonding is preferably carried out at ambient temperature, i.e., at about 20° C. It is, however, possible to carry out the bonding at a temperature of between 20° C. and 50° C., and more preferably between 20° C. and 30° C.

In addition, the bonding step is advantageously carried out under vacuum, which makes it possible to desorb water from the surfaces forming the bonding interface, i.e., the surface of the adhesive layer and the surface of the handle substrate or of the piezoelectric substrate.

Figure 4:
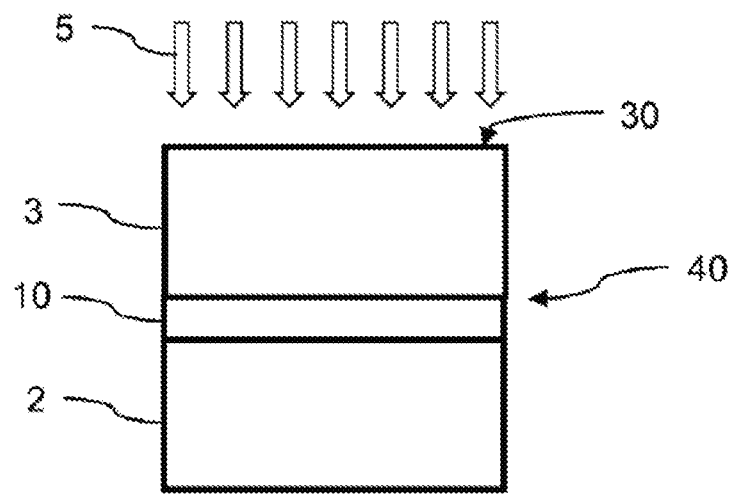
FIG. 4 schematically illustrates the step of polymerizing the adhesive layer in the heterostructure so as to form the donor virtual substrate, simply called the donor substrate, according to the present disclosure.

The heterostructure 4 is then subjected to irradiation with a light flux 5, in order to polymerize the adhesive layer 1. The irradiation of the heterostructure is shown in FIG. 4.

The light source is preferably a laser.

The light radiation, or light flux, is preferably ultra-violet (UV) radiation. Depending on the composition of the adhesive layer, UV radiation having a wavelength of between 320 nm (nanometers) and 365 nm will preferably be chosen.

The irradiation is carried out by exposing the free face 30 of the piezoelectric substrate 3 to the incident light radiation. Thus, the light flux 5 penetrates into the heterostructure 4 from the free face 30 of the piezoelectric substrate 3, passes through the piezoelectric substrate 3, until reaching the adhesive layer 1, thus causing the polymerization of the adhesive layer.

The polymerization of the adhesive layer 1 makes it possible to form a polymer layer 10, which ensures the mechanical cohesion of the heterostructure, keeping the handle substrate 2 and the piezoelectric substrate 3, which form the donor substrate, bonded together.

The irradiation of the heterostructure gives rise to a thermal process via which the piezoelectric layer 3, through which the radiation passes, is able to partially absorb the energy of the radiation and to heat up. Too much heating could destabilize the structure of the piezoelectric layer, which could lead to a degradation of the physical and chemical properties of the piezoelectric layer. In addition, too much heating could cause the piezoelectric layer and the handle substrate to deform due to their difference in thermal expansion coefficient, resulting in an overall deformation, called "bow," of the heterostructure and therefore of the resulting donor substrate.

In order to avoid excessive heating of the piezoelectric layer 3, the irradiation is advantageously pulsed, i.e., the heterostructure is exposed to a plurality of pulses of light rays. Each pulse lasts a set irradiation time, which may be equal or different from one pulse to the next. The pulses are spaced apart in time by a determined rest time during which the heterostructure is not exposed to light rays.

Those skilled in the art will be able to determine the irradiation time of each pulse, the rest time between each pulse, and the number of pulses to be applied to completely polymerize the adhesive layer.

Thus, for example, about ten pulses lasting 10 seconds each, separated by rest times also lasting 10 seconds each, could be implemented.

After irradiation, a donor substrate 40 comprising the heterostructure 4 with a polymerized adhesive layer 10 is obtained.

The polymerized adhesive layer 10 makes it possible to bond the piezoelectric substrate and the handle substrate without exposing them to a thermal budget that would be liable to deform them, which makes it possible to endow the donor substrate 40 with sufficient mechanical strength for the subsequent transfer of a piezoelectric layer.

The thickness of the polymerized adhesive layer 10 is preferably between 2 μm (microns) and 8 μm. This thickness depends, in particular, on the constituent material of the photopolymerizable adhesive layer deposited before bonding, on the thickness of the photopolymerizable adhesive layer, and on the experimental conditions of irradiation.

Optionally, the donor substrate 40 is subjected to a surface treatment that aims to make the exposed surface of the piezoelectric layer planar and to decrease its roughness.

A second subject of the present disclosure relates to a process for transferring a piezoelectric layer to a carrier substrate.

A donor substrate comprising the piezoelectric layer to be transferred is initially provided. The donor substrate is preferably obtained by means of the production process described above according to the first subject of the present disclosure.

A carrier substrate 6 capable of receiving the piezoelectric layer to be transferred is also provided. The carrier substrate is preferably made of silicon.

Figure 5:
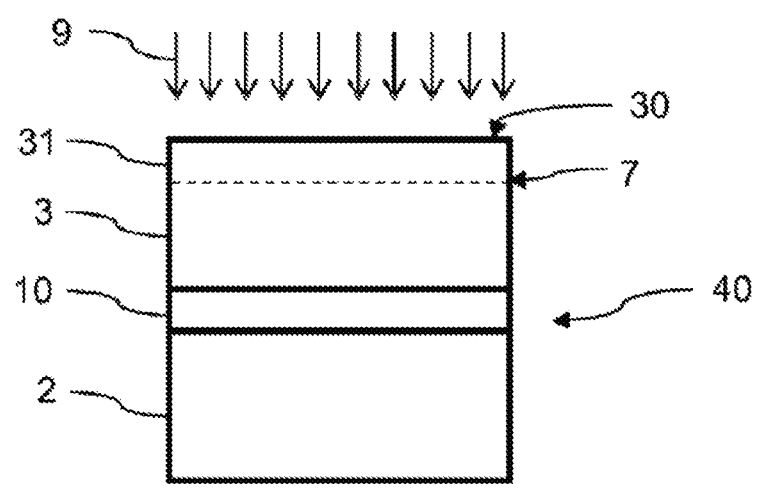
FIG. 5 schematically illustrates the step of implanting atomic species into the donor substrate of FIG. 4 so as to form a weakened zone therein.

According to a first step shown in FIG. 5, a weakened zone 7 is formed in the piezoelectric substrate 3, so as to delimit the piezoelectric layer 31 to be transferred. The depth of the weakened zone 7 relative to the exposed surface of the piezoelectric substrate determines the thickness of the piezoelectric layer to be transferred.

According to one preferred embodiment, the weakened zone is formed by implanting atomic species into the piezoelectric substrate, the implantation being shown in FIG. 5 by the arrows 9. The atomic species are implanted at a determined depth of the piezoelectric substrate, which determines the thickness of the piezoelectric layer to be transferred.

When the weakened zone is formed by implanting atomic species, the implanted atomic species are preferably hydrogen ions and/or helium ions.

Figure 6:
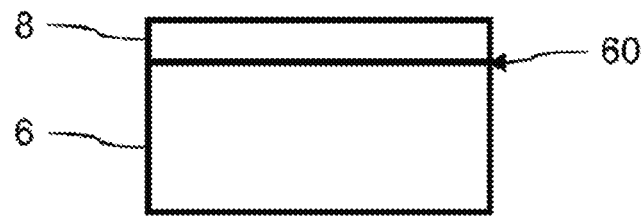
FIG. 6 schematically illustrates a carrier substrate on which a dielectric layer has been deposited.

A dielectric layer 8 is then formed on a main face of the carrier substrate 6 and/or of the piezoelectric substrate. FIG. 6 shows the carrier substrate 6 on which a dielectric layer 8 has been deposited.

Preferably, the dielectric layer is a glass layer deposited by spin coating on the piezoelectric substrate, referred to as "spin-on glass" (SOG). This technique is advantageous in that the deposition of the layer is carried out at ambient temperature and followed by a densifying anneal at a temperature of around 250° C., and therefore does not cause the substrate on which the dielectric layer is formed to deform.

Optionally, the free face 30 or 60 to be bonded on which the dielectric layer has not been deposited, of the donor substrate 40 or of the carrier substrate 6, undergoes a suitable treatment to subsequently allow hydrophilic molecular bonding of this surface with the other respective surface. Preferably, such a treatment involves forming, on the carrier substrate, an oxide layer, or a nitride layer, or a layer comprising a combination of nitride and oxide, or a superposition of an oxide layer and of a nitride layer. For example, in the case of a carrier substrate made of silicon, a layer of silicon oxide $SiO_2$, or a layer of silicon nitride $Si_3N_4$, a layer comprising a combination of silicon nitride and oxide SiOxNy, or a superposition of a layer of silicon oxide $SiO_2$ and of a layer of silicon nitride $Si_3N_4$ could be formed.

A layer of silicon oxide will preferably be formed when the carrier substrate is made of silicon.

Figure 7:
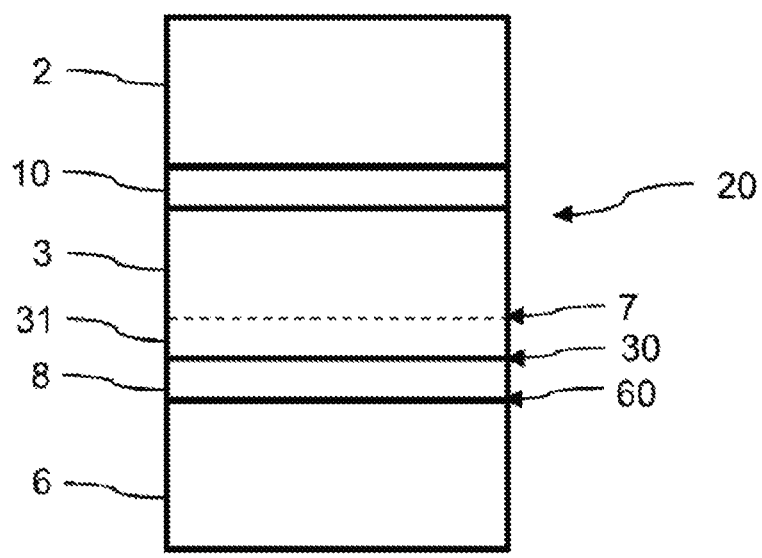
FIG. 7 schematically illustrates the step of bonding the weakened donor substrate to the carrier substrate.

Next, the donor substrate 40 is bonded to the carrier substrate 6, as illustrated in FIG. 7.

The bonding is carried out such that the dielectric layer 8 is located at the bonding interface. The multilayer structure 20 formed then successively comprises the carrier substrate 6, the dielectric layer 8, the piezoelectric layer 31 to be transferred from the piezoelectric substrate 3, the polymer layer 10, and the handle substrate 2.

After bonding, the multilayer structure 20 is subjected to a thermal anneal and the donor substrate 40 is detached from the carrier substrate 6 along the weakened zone 7, thus allowing the piezoelectric layer 31 to be transferred to the carrier substrate 6.

Figure 8:
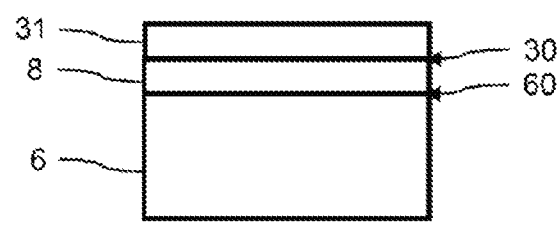
FIG. 8 illustrates the substrate obtained after splitting and separating the donor substrate along the weakened zone.

FIG. 8 illustrates the final structure obtained after splitting and separating the donor virtual substrate along the weakened zone, comprising the transferred piezoelectric layer 31 arranged on the carrier substrate 6, with the dielectric layer 8 located at the interface of the transferred piezoelectric layer 31 and the carrier substrate 6.

The step of splitting and separating the donor substrate is carried out at a temperature such that the polymerized adhesive layer is not degraded. A temperature of less than or equal to 300° C. makes it possible to prevent such degradation of the polymerized adhesive layer. A temperature of the order of 160° C. is sufficient to split the piezoelectric substrate along the weakened zone.

Since the piezoelectric substrate is held between two substrates (namely the handle substrate and the carrier substrate) whose thermal expansion coefficients are close, it does not experience a differential deformation during the implementation of the anneal.

A third subject of the present disclosure relates to a non-limiting application of the transfer process according to the second subject of the present disclosure. A process is proposed for producing a bulk acoustic wave device comprising the deposition of electrodes on two opposite faces of a piezoelectric layer produced according to the transfer process according to the second subject of the present disclosure.

Figure 9:
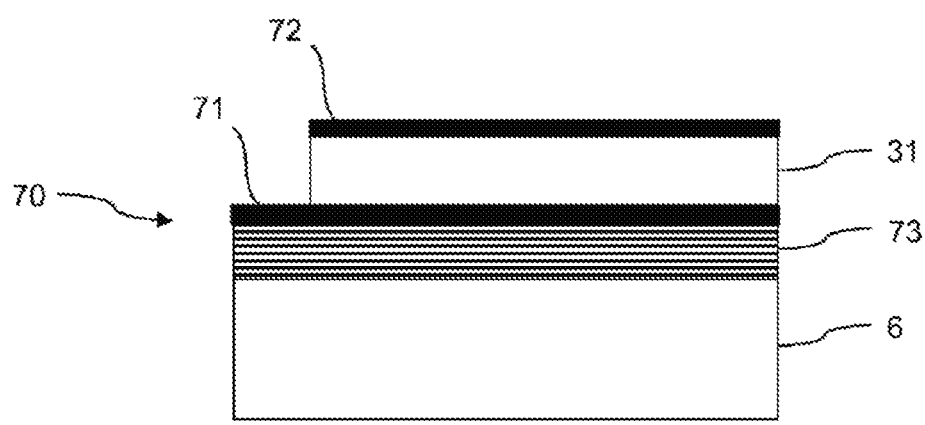
FIG. 9 is a schematic illustration of a bulk acoustic wave filter according to one embodiment of the present disclosure.

FIG. 9 is a schematic of a bulk acoustic wave resonator.

The resonator 70 comprises a thin piezoelectric layer 31 (i.e., with a thickness of generally less than 1 µm, preferably less than 0.2 µm) and two electrodes 71, 72 arranged on either side of the piezoelectric layer 31. The piezoelectric layer 31 rests on a carrier substrate 6. To isolate the resonator from the substrate and thus prevent the propagation of waves into the substrate, a Bragg mirror 73 is interposed between the electrode 71 and the substrate 6. Alternatively (not shown), this isolation could be achieved by providing a cavity between the substrate and the piezoelectric layer. These different arrangements are known to those skilled in the art and will therefore not be described in detail in the present text.

In certain cases, the carrier substrate may not be optimal for the final application. It may then be advantageous to transfer the layer 31 to a final substrate (not shown), the properties of which are chosen according to the intended application, by bonding it to the final substrate and by removing the carrier substrate by means of any suitable technique.

To produce a bulk acoustic wave device, according to one embodiment, an adjustment to the process described above must be made. First, before the bonding step illustrated in FIG. 7, a first electrode is deposited on the free surface of the layer 31 to be transferred from the donor substrate, this first electrode 71 (FIG. 9) being buried in the final stack. After the transfer step illustrated in FIG. 8, a second electrode 72 (FIG. 9) is deposited on the free surface of the layer 31, opposite the first electrode 71. Another option is to transfer the layer 31 to a final substrate as mentioned above and to form the electrodes before and after the transfer. Second, to prevent the propagation of the acoustic waves into the carrier substrate 6, it is possible to integrate therewithin an isolation means, which may be, for example, a Bragg mirror (as illustrated in FIG. 9) or a cavity previously etched into the carrier substrate or into the final substrate, as applicable.

Lastly, it goes without saying that the disclosure that has just been given is only one particular illustration, which is in no way limiting as to the fields of application of the present disclosure.

The invention claimed is:

1. A process for transferring a piezoelectric layer to a carrier substrate, comprising:
    providing a donor substrate including a heterostructure comprising a piezoelectric substrate bonded to a handle substrate, and a polymerized adhesive layer at an interface between the piezoelectric substrate and the handle substrate;
    forming a weakened zone in the piezoelectric substrate so as to delimit the piezoelectric layer to be transferred;
    providing the carrier substrate;
    forming a dielectric layer on a main face of at least one of the carrier substrate or the piezoelectric substrate,
    bonding the donor substrate to the carrier substrate, the dielectric layer being at the bonding interface; and
    splitting and separating the piezoelectric substrate along the weakened zone at a temperature less than or equal to 300° C.

2. The process of claim 1, wherein the dielectric layer is a glass layer deposited by spin coating.

3. The process of claim 2, further comprising, prior to bonding, forming an oxide layer, or a nitride layer, or a layer comprising a combination of nitride and oxide, or a superposition of at least one oxide layer and one nitride layer on the carrier substrate.

4. The process of claim 3, wherein forming the weakened zone comprises implanting atomic species into the piezoelectric substrate.

5. The process of claim 4, wherein the handle substrate is a substrate comprising silicon, sapphire, polycrystalline aluminum nitride (AlN) or gallium arsenide (GaAs).

6. The process of claim 5, wherein a thickness of the polymerized adhesive layer is between 2 µm and 8 µm.

7. The process of claim 1, further comprising, prior to bonding, forming an oxide layer, or a nitride layer, or a layer comprising a combination of nitride and oxide, or a superposition of at least one oxide layer and one nitride layer on the carrier substrate.

8. The process of claim 1, wherein forming the weakened zone comprises implanting atomic species into the piezoelectric substrate.

9. The process of claim 1, wherein the handle substrate is a substrate comprising silicon, sapphire, polycrystalline aluminum nitride (AlN) or gallium arsenide (GaAs).

10. The process of claim 1, wherein a thickness of the polymerized adhesive layer is between 2 µm and 8 µm.

11. A process for producing a bulk acoustic wave device, comprising:
providing a donor substrate including a heterostructure comprising a piezoelectric substrate bonded to a handle substrate, and a polymerized adhesive layer at an interface between the piezoelectric substrate and the handle substrate;
forming a weakened zone in the piezoelectric substrate so as to delimit a piezoelectric layer to be transferred to a carrier substrate;
providing the carrier substrate;
forming a dielectric layer on a main face of at least one of the carrier substrate or the piezoelectric substrate;
bonding the donor substrate to the carrier substrate, the dielectric layer being at the bonding interface;
splitting and separating the piezoelectric substrate along the weakened zone at a temperature less than or equal to 300° C. and transferring the piezoelectric layer to be transferred to the carrier substrate; and
providing electrodes on two opposite faces of the transferred piezoelectric layer.

12. The process of claim 11, wherein the dielectric layer is a glass layer deposited by spin coating-on the piezoelectric substrate.

13. The process of claim 12, further comprising, prior to bonding, forming an oxide layer, or a nitride layer, or a layer comprising a combination of nitride and oxide, or a superposition of at least one oxide layer and one nitride layer on the carrier substrate.

14. The process of claim 13, wherein forming the weakened zone comprises implanting atomic species into the piezoelectric substrate.

15. The process of claim 14, wherein the handle substrate is a substrate comprising silicon, sapphire, polycrystalline aluminum nitride (AlN) or gallium arsenide (GaAs).

16. The process of claim 15, wherein a thickness of the polymerized adhesive layer is between 2 µm and 8 µm.

17. The process of claim 11, further comprising, prior to bonding, forming an oxide layer, or a nitride layer, or a layer comprising a combination of nitride and oxide, or a superposition of at least one oxide layer and one nitride layer on the carrier substrate.

18. The process of claim 11, wherein forming the weakened zone comprises implanting atomic species into the piezoelectric substrate.

19. The process of claim 11, wherein the handle substrate is a substrate comprising silicon, sapphire, polycrystalline aluminum nitride (AlN) or gallium arsenide (GaAs).

20. The process of claim 11, wherein a thickness of the polymerized adhesive layer is between 2 µm and 8 µm.

* * * * *